United States Patent
Sreenivasan

(10) Patent No.: US 7,357,876 B2
(45) Date of Patent: Apr. 15, 2008

(54) ELIMINATING PRINTABILITY OF SUB-RESOLUTION DEFECTS IN IMPRINT LITHOGRAPHY

(75) Inventor: Sidlgata V. Sreenivasan, Austin, TX (US)

(73) Assignee: Molecular Imprints, Inc., Austin, TX (US)

(*) Notice: Subject to any disclaimer, the term of this patent is extended or adjusted under 35 U.S.C. 154(b) by 224 days.

(21) Appl. No.: 11/292,394

(22) Filed: Nov. 30, 2005

(65) Prior Publication Data

US 2006/0113697 A1 Jun. 1, 2006

Related U.S. Application Data

(60) Provisional application No. 60/632,104, filed on Dec. 1, 2004.

(51) Int. Cl.
*B44C 1/22* (2006.01)
*H01L 21/00* (2006.01)

(52) U.S. Cl. .................... 216/41; 216/58; 216/83; 216/11; 438/706; 438/689; 264/1.21

(58) Field of Classification Search ................ 216/41, 216/83, 58, 11; 438/706, 689; 264/1.21
See application file for complete search history.

(56) References Cited

U.S. PATENT DOCUMENTS

| | | | |
|---|---|---|---|
| 4,070,116 A | 1/1978 | Frosch et al. | |
| 4,267,212 A | 5/1981 | Sakawaki | |
| 4,426,247 A | 1/1984 | Tamamura et al. | |
| 4,440,804 A | 4/1984 | Milgram | |
| 4,507,331 A | 3/1985 | Hiraoka | |
| 4,512,848 A | 4/1985 | Deckman et al. | |
| 4,552,832 A | 11/1985 | Blume et al. | |
| 4,657,845 A | 4/1987 | Frchet et al. | |
| 4,692,205 A | 9/1987 | Sachdev et al. | |
| 4,707,218 A | 11/1987 | Giammarco et al. | |
| 4,731,155 A | 3/1988 | Napoli et al. | |
| 4,737,425 A | 4/1988 | Lin et al. | |
| 4,891,303 A | 1/1990 | Garza et al. | |

(Continued)

FOREIGN PATENT DOCUMENTS

JP 58-129074 8/1983

(Continued)

OTHER PUBLICATIONS

Feynman, There's Plenty of Room at the Bottom, Dec. 1, 1959.

(Continued)

*Primary Examiner*—Shamim Ahmed
(74) *Attorney, Agent, or Firm*—Michael D. Carter; Fish & Richardson P.C.

(57) ABSTRACT

The present invention provides a method of forming a desired pattern in a layer positioned on a substrate with a mold, the method including, inter alia, contacting the layer with the mold forming a shape therein having a plurality of features extending in a first direction; and altering dimensions of the shape of the layer in a second direction, orthogonal to the first direction, to eliminate a subset of the plurality of features having a dimension less that a predetermined magnitude while obtaining the desired pattern in the layer.

19 Claims, 8 Drawing Sheets

U.S. PATENT DOCUMENTS

| | | | |
|---|---|---|---|
| 4,909,151 A | 3/1990 | Fukui et al. | |
| 4,931,351 A | 6/1990 | McColgin et al. | |
| 4,959,252 A | 9/1990 | Bonnebat et al. | |
| 4,976,818 A | 12/1990 | Hashimoto et al. | |
| 5,028,366 A | 7/1991 | Harakal et al. | |
| 5,071,694 A | 12/1991 | Uekita et al. | |
| 5,073,230 A | 12/1991 | Maracas et al. | |
| 5,110,514 A | 5/1992 | Soane | |
| 5,126,006 A | 6/1992 | Cronin et al. | |
| 5,151,754 A | 9/1992 | Ishibashi et al. | |
| 5,173,393 A | 12/1992 | Sezi et al. | |
| 5,198,326 A | 3/1993 | Hashimoto et al. | |
| 5,234,793 A | 8/1993 | Sebald et al. | |
| 5,240,550 A | 8/1993 | Boehnke et al. | |
| 5,246,880 A | 9/1993 | Reele et al. | |
| 5,259,926 A | 11/1993 | Kuwabara et al. | |
| 5,277,749 A | 1/1994 | Griffith et al. | |
| 5,314,772 A | 5/1994 | Kozicki et al. | |
| 5,357,122 A | 10/1994 | Okubora et al. | |
| 5,425,848 A | 6/1995 | Haisma et al. | |
| 5,434,107 A | 7/1995 | Paranjpe | |
| 5,480,047 A | 1/1996 | Tanigawa et al. | |
| 5,512,131 A | 4/1996 | Kumar et al. | |
| 5,545,367 A | 8/1996 | Bae et al. | |
| 5,601,641 A | 2/1997 | Stephens | |
| 5,654,238 A | 8/1997 | Cronin et al. | |
| 5,669,303 A | 9/1997 | Maracas et al. | |
| 5,700,626 A | 12/1997 | Lee et al. | |
| 5,743,998 A | 4/1998 | Park | |
| 5,753,014 A | 5/1998 | Van Rijn | |
| 5,772,905 A | 6/1998 | Chou | |
| 5,776,748 A | 7/1998 | Singhvi et al. | |
| 5,820,769 A | 10/1998 | Chou | |
| 5,849,209 A | 12/1998 | Kindt-Larsen et al. | |
| 5,849,222 A | 12/1998 | Jen et al. | |
| 5,888,650 A | 3/1999 | Calhoun et al. | |
| 5,900,160 A | 5/1999 | Whitesides et al. | |
| 5,905,104 A | 5/1999 | Eklund et al. | |
| 5,907,782 A | 5/1999 | Wu | |
| 5,948,470 A | 9/1999 | Harrison et al. | |
| 5,956,216 A | 9/1999 | Chou | |
| 6,033,977 A | 3/2000 | Gutsche et al. | |
| 6,046,056 A | 4/2000 | Parce et al. | |
| 6,074,827 A | 6/2000 | Nelson et al. | |
| 6,096,655 A | 8/2000 | Lee et al. | |
| 6,180,239 B1 | 1/2001 | Whitesides et al. | |
| 6,218,316 B1 | 4/2001 | Marsh | |
| 6,232,175 B1 | 5/2001 | Liu et al. | |
| 6,245,213 B1 | 6/2001 | Olsson et al. | |
| 6,309,580 B1 | 10/2001 | Chou | |
| 6,326,627 B1 | 12/2001 | Putvinski et al. | |
| 6,329,256 B1 | 12/2001 | Ibok | |
| 6,334,960 B1 | 1/2002 | Willson et al. | |
| 6,337,262 B1 | 1/2002 | Pradeep et al. | |
| 6,342,097 B1 | 1/2002 | Terry et al. | |
| 6,355,198 B1 | 3/2002 | Kim et al. | |
| 6,387,787 B1 | 5/2002 | Mancini et al. | |
| 6,391,217 B2 | 5/2002 | Schaffer et al. | |
| 6,426,288 B1 | 7/2002 | Meikle | |
| 6,455,411 B1 | 9/2002 | Jiang et al. | |
| 6,468,896 B2 | 10/2002 | Rohr et al. | |
| 6,482,742 B1 | 11/2002 | Chou | |
| 6,503,829 B2 | 1/2003 | Kim et al. | |
| 6,517,977 B2 | 2/2003 | Resnick et al. | |
| 6,517,995 B1 | 2/2003 | Jacobson et al. | |
| 6,518,189 B1 | 2/2003 | Chou | |
| 6,580,172 B2 | 6/2003 | Mancini et al. | |
| 6,646,662 B1 | 11/2003 | Nebashi et al. | |
| 6,696,220 B2 | 2/2004 | Bailey et al. | |
| 6,703,190 B2 | 3/2004 | Elian et al. | |
| 6,713,238 B1 | 3/2004 | Chou et al. | |
| 6,716,767 B2 | 4/2004 | Shih et al. | |
| 6,719,915 B2 | 4/2004 | Willson et al. | |
| 6,730,256 B1 | 5/2004 | Bloomstein et al. | |
| 6,737,202 B2 | 5/2004 | Gehoski et al. | |
| 6,743,713 B2 | 6/2004 | Mukher-Hee-Roy et al. | |
| 6,767,983 B1 | 7/2004 | Fujiyama et al. | |
| 6,776,094 B1 | 8/2004 | Whitesides et al. | |
| 6,777,170 B1 | 8/2004 | Bloomstein et al. | |
| 6,809,356 B2 | 10/2004 | Chou | |
| 6,814,879 B2 | 11/2004 | Shibata | |
| 6,820,677 B2 | 11/2004 | Grinberg et al. | |
| 6,828,244 B2 | 12/2004 | Chou | |
| 6,849,558 B2 | 2/2005 | Schaper | |
| 6,870,301 B2 | 3/2005 | Choi et al. | |
| 6,900,881 B2 | 5/2005 | Sreenivasan et al. | |
| 6,908,861 B2 | 6/2005 | Sreenivasan et al. | |
| 6,916,584 B2 | 7/2005 | Sreenivasan et al. | |
| 6,932,934 B2 | 8/2005 | Choi et al. | |
| 7,214,624 B2 * | 5/2007 | Fujita et al. | 438/706 |
| 2002/0038916 A1 * | 4/2002 | Chiu et al. | 264/1.21 |
| 2002/0042027 A1 | 4/2002 | Chou et al. | |
| 2002/0094496 A1 | 7/2002 | Choi et al. | |
| 2002/0132482 A1 | 9/2002 | Chou | |
| 2002/0167117 A1 | 11/2002 | Chou | |
| 2002/0177319 A1 | 11/2002 | Chou | |
| 2003/0034329 A1 | 2/2003 | Chou | |
| 2003/0062334 A1 | 4/2003 | Lee et al. | |
| 2003/0080471 A1 | 5/2003 | Chou | |
| 2003/0080472 A1 | 5/2003 | Chou | |
| 2003/0184917 A1 | 10/2003 | Chang et al. | |
| 2004/0021866 A1 | 2/2004 | Watts et al. | |
| 2004/0022888 A1 | 2/2004 | Sreenivasan et al. | |
| 2004/0029041 A1 | 2/2004 | Shih et al. | |
| 2004/0029396 A1 | 2/2004 | Zhang et al. | |
| 2004/0036201 A1 | 2/2004 | Chou et al. | |
| 2004/0038552 A1 | 2/2004 | Watts et al. | |
| 2004/0046288 A1 | 3/2004 | Chou | |
| 2004/0065252 A1 | 4/2004 | Sreenivasan et al. | |
| 2004/0065976 A1 | 4/2004 | Sreenivasan et al. | |
| 2004/0110856 A1 | 6/2004 | Young et al. | |
| 2004/0118809 A1 | 6/2004 | Chou et al. | |
| 2004/0124566 A1 | 7/2004 | Sreenivasan et al. | |
| 2004/0131718 A1 | 7/2004 | Chou et al. | |
| 2004/0137734 A1 | 7/2004 | Chou et al. | |
| 2004/0146792 A1 * | 7/2004 | Nimmakayala et al. | 430/22 |
| 2004/0156108 A1 | 8/2004 | Chou et al | |
| 2004/0188381 A1 | 9/2004 | Sreenivasan | |
| 2004/0192041 A1 | 9/2004 | Jeong et al. | |
| 2004/0197843 A1 | 10/2004 | Chou et al. | |
| 2004/0211754 A1 | 10/2004 | Sreenivasan | |
| 2004/0224261 A1 | 11/2004 | Resnick et al. | |
| 2004/0250945 A1 | 12/2004 | Zheng et al. | |
| 2005/0037143 A1 | 2/2005 | Chou et al. | |
| 2006/0017876 A1 | 1/2006 | Watts | |

FOREIGN PATENT DOCUMENTS

| | | |
|---|---|---|
| JP | 1-196749 | 8/1989 |
| JP | 02-24848 | 1/1990 |
| JP | 02-92603 | 4/1990 |
| JP | 02192045 | 7/1990 |
| JP | 4-70379 | 5/1992 |
| WO | WO 87/02935 | 5/1987 |
| WO | WO 99/05724 | 2/1999 |
| WO | WO 00/21689 | 4/2000 |
| WO | WO 01/47003 | 6/2001 |
| WO | WO 2005/031299 A2 | 4/2005 |
| WO | WO 2005/031855 A1 | 4/2005 |

OTHER PUBLICATIONS

Johnson et al., Advances in Step and Flash Imprint Lithography, SPIE Microlithography Conference Feb. 23, 2003.

Chou et al., Lithographically Induced Self-assembly of Periodic Polymer Micropillar Arrays, J. Vac. Sci. Technol. B 17 (6), pp. 3197-3202 Nov. 1, 1999.
Colburn et al., Step and Flash Imprint Lithography: A New Approach to High-Resolution Patterning, Proc. Of SPIE, vol. 3676 Mar. 1, 1999.
Kotachi et al., Si-Containing Positive Resist for ArF Excimer Laser Lithography, Photopolymer Science and Technology, pp. 615-622 Nov. 4, 1995.
Chou, Nanoimprint Lithography and Lithographically Induced Self-Assembly, MRS Bulletin, pp. 512-517 Jul. 1, 2001.
Choi et al., Design of Orientation Stages for Step and Flash Imprint Lithography, Precision Engineering, pp. 192-199 Jan. 1, 2001.
Xia et al., Soft Lithography, Angew. Chem. Int. Ed., pp. 550-575 Jan. 1, 1998.
Chou et al., Imprint Lithography with Sub-10 nm Feature Size and High Throughput, Microelectronic Engineering 35, pp. 237-240 Jan. 1, 1997.
Haisma et al., Mold-assisted Nanolithography: A Process for Reliable Pattern Replication, J. Vac. Sci. Technol. B, pp. 4124-4128 Nov. 1, 1996.
Lin, Multi-Layer Resist Systems, Introduction to Microlithography, pp. 287-349 Feb. 14, 1983.
Chou et al., Imprint of Sub-25 nm Vias and Trenches in Polymers, Appl. Phys. Lett. 67 (21) Nov. 20, 1995.
Nguyen, Asymmetric Fluid-Structure Dynamics in Nanoscale Imprint Lithography, The University of Texas at Austin, pp. 1-111 Aug. 1, 2001.
Colburn et al., Step and Flash Imprint Lithography for sub-100 nm Patterning, Proceedings of SPIE vol. 3397, pp. 453-457 Jan. 1, 2000.
Chou et al., Imprint Lithography with 25-Nanometer Resolution, Science vol. 272, pp. 85-87 Apr. 5, 1996.
NERAC.COM Retro Search, Reduction of Dimension of Contact Holes, Aug. 31, 2004.
NERAC.COM Retro Search, Trim Etching of Features Formed on an Organic Layer, Sep. 2, 2004.
NERAC.COM Retro Search, Multi-Layer Resists, Sep. 2, 2004.
Heidari, Nanoimprint Lithography at the 6 in. Wafer Scale, J. Vac. Sci. Technol. B 18(6), pp. 3557-3560 Nov. 1, 2000.
Abstract of Japanese Patent 02-92603, Aug. 12, 2004.
Translation of Japanese Patent 02-92603, Apr. 3, 1990.
Translation of Japanese Patent 02-24848, Jan. 26, 1990.
Abstract of Japanese Patent 02-24848, Jan. 26, 1990.
Luurtsema, Spin Coating for Rectangular Substrates, Retrieved May 23, 2002 from URL: http://buffy.eecs.berkelye.edu/IRO/Summary/97abstracts/gluurts.2.html May 23, 2002.
Photoresist Coating Methods, e-mail from Susan Bagen(BAGEN@aol.com) to Dhaval Shah Sep. 18, 1997.
Nakamatsu et al., Bilayer Resist Method for Room-Temperature Nanoimprint Lithography, Japanese Journal of Applied Physics, vol. 43, No. 6B, pp. 4050-4053 Jun. 29, 2004.
Abstract of Japanese Patent 58-129074, Aug. 1, 1983.
Chou et al., Ultrafast and Direct Imprint of Nanostructures in Silicon, Nature, Col. 417, (Jun. 2002), pp. 835-837 Jun. 1, 2002.
Chou et al., Nanoimprint Lithography, Journal of Vacuum Science Technolgoy B 14(16), pp. 4129-4133 Nov. 1, 1996.
Colburn et al., Development and Advantages of Step-and-Flash Lithography, Solid State Technology Jul. 1, 2001.
Colburn et al., Characterization and Modeling of Volumetric and Mechanical Properties for Step and Flash Imprint Lithography Photopolymers, Journal of Vacuum Science Technology. vol. b. 19(6) Nov. 1, 2001.
Bailey et al., Step and Flash Imprint Lithography: Defect Analysis, Journal of Vacuum Science, B 19(6), pp. 2806-2810 Nov. 1, 2001.
Bailey et al., Step and Flash Imprint Lithography: Template Surface Treatment and Defect Analysis, Journal of Vacuum Science, B 18(6), pp. 3572-3577 Nov. 1, 2000.
U.S. Appl. No. 10/843,194, naming Inventors Sreenivasan et al., entitled A Method of Patterning a Conductive Layer on a Substrate, filed May 11, 2004.
U.S. Appl. No. 10/917,563, naming Inventors Sreenivasan, entitled A Method of Planarizing a Substrate, filed Aug. 13, 2004.
U.S. Appl. No. 10/951,014, naming Inventors Sreenivasan, entitled Method of Compensating for a Volumetric Shrinkage of a Material Disposed Upon a Substrate to Form a Substantially Planar Structure Therefrom, filed Sep. 27, 2004.
U.S. Appl. No. 10/946,565, naming Inventors Vidusek et al., entitled Method of Forming an In-Situ Recessed Structure, filed Sep. 21, 2004.
U.S. Appl. No. 10/946,159, naming Inventors Miller et al., entitled Patterning Surfaces While Providing Greater Control of Recess Anistrophy, filed Sep. 21, 2004.
U.S. Appl. No. 10/946,577, naming Inventors Sreenivasan et al., entitled Reverse Tone Patterning on Surfaces Having Surface Planarity Pertubations, filed Sep. 21, 2004.
U.S. Appl. No. 10/946,566, naming Inventors Sreenivasan et al., entitled Pattern Reversal Employing Thick Residual Layers, filed Sep. 21, 2004.
U.S. Appl. No. 10/946,570, naming Inventors Sreenivasan, entitled Method fo Forming a Recessed Structure Employing a Reverse Tone Process, filed Sep. 21, 2004.
U.S. Appl. No. 10/946,574, naming Inventors Stacey et al., entitled Patterning Substrates Employing Multi-Film Layers Defining Etch-Differential Interfaces, filed Sep. 21, 2004.
Schneider et al., Stripes of Partially Fluorinated Alkyl Chains: Dipolar Langmuir Monolayers, J. Chem. Phys. vol. 122, Issue 9 Mar. 1, 2005.
Data Sheet for MAK (Methyl n-Amyl Ketone), www.sp-chem.com/fine_e Jan. 1, 2003.
Data Sheet for gamma-Glycidoxypropyltrimethoxysilane, www.powerchemical.net/3100.htm Dec. 5, 2003.
Silicon or Silica, www.mii.org/Minerals/photosil Mar. 31, 2005.
Electronic Devices and Circuits, people.deas.harvard.edu/~jones/es154/lectures/lecture_2/materials/materials.html Mar. 31, 2005.
Data Sheet for Cymel 303ULF, www.cytec.com, no date provided.
Data Sheet for Cycat 4040, www.cytec.com, no date provided.
International Chemical Safety Card for p-Toluenseulfonic Acid, www.itcilo.it/english/actrav/telearn/osh/ic/104154.htm Dec. 5, 2003.
Data Sheet for p-Toluenesulfonic Acid, NIOSH Manual of Analytical Methods (NMAM), Fourth Edition, no date provided.
Data Sheet for Dow Corning Z-6018, no date provided.
Data Sheet for Methyl Amyl Ketone, www.arb.ca.gov/db/solvents/solvent_pages/Ketones-HTML/methyl_amyl.htm Mar. 31, 2005.
Park et al., Aligning Liquid Crystals Using Replicated Nanopatterns, PSI Scientific Report 2002, vol. VII, p. 85 Mar. 1, 2003.
U.S. Appl. No. 11/126,946, naming Inventors Choi et al., entitled Formation of Discontinuous Films During an Imprint Lithography Process, filed May 11, 2005.
U.S. Appl. No. 11/127,041, naming Inventors Sreenivasan et al., entitled Step and Repeat Imprint Lithography Processes, filed May 11, 2005.
U.S. Appl. No. 11/127,060, naming Inventors Sreenivasan et al., entitled Step and Repeat Imprint Lithography Systems, filed May 11, 2005.
U.S. Appl. No. 11/184,664, naming Inventors LaBrake, entitled Method of controlling the critical dimension of structures formed on a substrate, filed Jul. 19, 2005.
Miller et al., Fabrication of Nanometer Sized Features on Non-Flat Substrates Using a Nano-Imprint Lithography Process, SPIE Microlithography Conference Feb. 1, 2005.
Stewart et al., Direct Imprinting of Dielectric Materials for Dual Damascene Processing, SPIE Microlithogrpahy Conference Feb. 1, 2003.
Smith et al., Employing Step and Flsah Imprint Lithography for Gate Level Patterning of a MOSFET Device, SPIE Microlithography Conference Feb. 1, 2003.
U.S. Appl. No. 11/240,708, naming Inventors Wang et al., entitled Etching Technique to Planarize a Multi-Layer Structure, filed Sep. 30, 2005.

* cited by examiner

ELIMINATING PRINTABILITY OF SUB-RESOLUTION DEFECTS IN IMPRINT LITHOGRAPHY

CROSS-REFERENCE TO RELATED APPLICATIONS

The present application claims priority to U.S. Provisional Application No. 60/632,104, filed on Dec. 1, 2004, entitled "Eliminating Printabilty of Sub-Resolution Defects in Imprint Lithography," listing Sidlgata V. Sreenivasan as an inventor, the entirety of which is incorporated herein by reference.

BACKGROUND OF THE INVENTION

The field of the invention relates generally to nano-fabrication of structures. More particularly, the present invention is directed to a technique to reduce defect replication in patterns formed during nano-scale fabrication.

Nano-fabrication involves the fabrication of very small structures, e.g., having features on the order of nano-meters or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as United States patent application publication 2004/0065976 filed as U.S. patent application Ser. No. 10/264,960, entitled, "Method and a Mold to Arrange Features on a Substrate to Replicate Features having Minimal Dimensional Variability"; United States patent application publication 2004/0065252 filed as U.S. patent application Ser. No. 10/264,926, entitled "Method of Forming a Layer on a Substrate to Facilitate Fabrication of Metrology Standards"; and U.S. Pat. No. 6,936,194, entitled "Functional Patterning Material for Imprint Lithography Processes," all of which are assigned to the assignee of the present invention.

The fundamental imprint lithography technique disclosed in each of the aforementioned United States patent application publications and United States patent includes formation of a relief pattern in a polymerizable layer and transferring a pattern corresponding to the relief pattern into an underlying substrate. The substrate may be positioned upon a motion stage to obtain a desired position to facilitate patterning thereof. To that end, a template is employed spaced-apart from the substrate with a formable liquid present between the template and the substrate. The liquid is solidified to form a solidified layer that has a pattern recorded therein that is conforming to a shape of the surface of the template in contact with the liquid. The template is then separated from the solidified layer such that the template and the substrate are spaced-apart. The substrate and the solidified layer are then subjected to processes to transfer, into the substrate, a relief image that corresponds to the pattern in the solidified layer.

To that end, imprint lithography may have unlimited resolution in pattern replication. However, this may result in difficulties related to defect sensitive applications such as microelectronic devices. The primary advantage of all "imaging" lithography solutions such as photolithography, EUV lithography, e-beam, etc. is that the machine system can be "de-tuned" to set a desired resolution limit. For example, in optical/EUV lithography, the resolution of the process is defined by $R=(k_1 \times \lambda)/NA$, where $k_1$ is a scaling factor that is less than 1 and is a function of mask complexity and resist dose settings; λ is the wavelength of light; and NA is the numerical aperture of the optical system. For EUV lithography, $\lambda = \sim 13.2$ nm. To that end, to print devices using EUV lithography with a desired resolution ($d_R$) of 40 nm (with $k_1=0.8$ based on acceptable mask and process complexity), NA needs to equal ~0.264. As a result, any features that were placed on the mask that may result in features less than the desired resolution (40 nm) on the wafer may be inherently "filtered out". This sets the threshold on what should be detectable as defects on the mask using a mask inspection tool to avoid the printing of defects that are less than $d_R=40$ nm.

To that end, it may be desired to provide an improved method of patterning substrates substantially absent of defects employing imprint lithography.

SUMMARY OF THE INVENTION

The present invention provides a method of forming a desired pattern in a layer positioned on a substrate with a mold, the method including, inter alia, contacting the layer with the mold forming a shape therein having a plurality of features extending in a first direction; and altering dimensions of the shape of the layer in a second direction, orthogonal to the first direction, to eliminate a subset of the plurality of features having a dimension less that a predetermined magnitude while obtaining the desired pattern in the layer. These embodiments and others are described more fully below.

BRIEF DESCRIPTION OF THE DRAWINGS

FIG. 1 is a simplified plan view of an imprint lithography system having a mold spaced-apart from a multi-layered structure;

FIG. 2 is a simplified side view of the multi-layered structure shown in FIG. 1, having a pattern thereon comprising recessed and raised defects;

FIG. 3 is a simplified side view of the mold, having protruding and indention defects therein, after contact with the multi-layered structure shown in FIG. 1, forming a plurality of features therein;

FIG. 4 is a simplified side view of the multi-layered structure shown in FIG. 3, after exposure to a trim etch to eliminate features associated with the indention defect of the mold;

FIG. 5 is a simplified side view of the multi-layered structure shown in FIG. 4, having a conformal layer positioned thereon;

FIG. 6 is simplified side view of the multi-layered structure shown in FIG. 5, having a crown surface formed thereon;

FIG. 7 is a simplified side view of the multi-layered structure shown in FIG. 6, after subjecting the crown surface to an etch process to expose regions of the substrate;

FIG. 8 is a simplified side view of the multi-layered structure shown in FIG. 7, after exposure to a blanket etch, with features associated with the indention defect of the mold removed from the multi-layered structure;

DETAILED DESCRIPTION OF THE INVENTION

Figure 1:
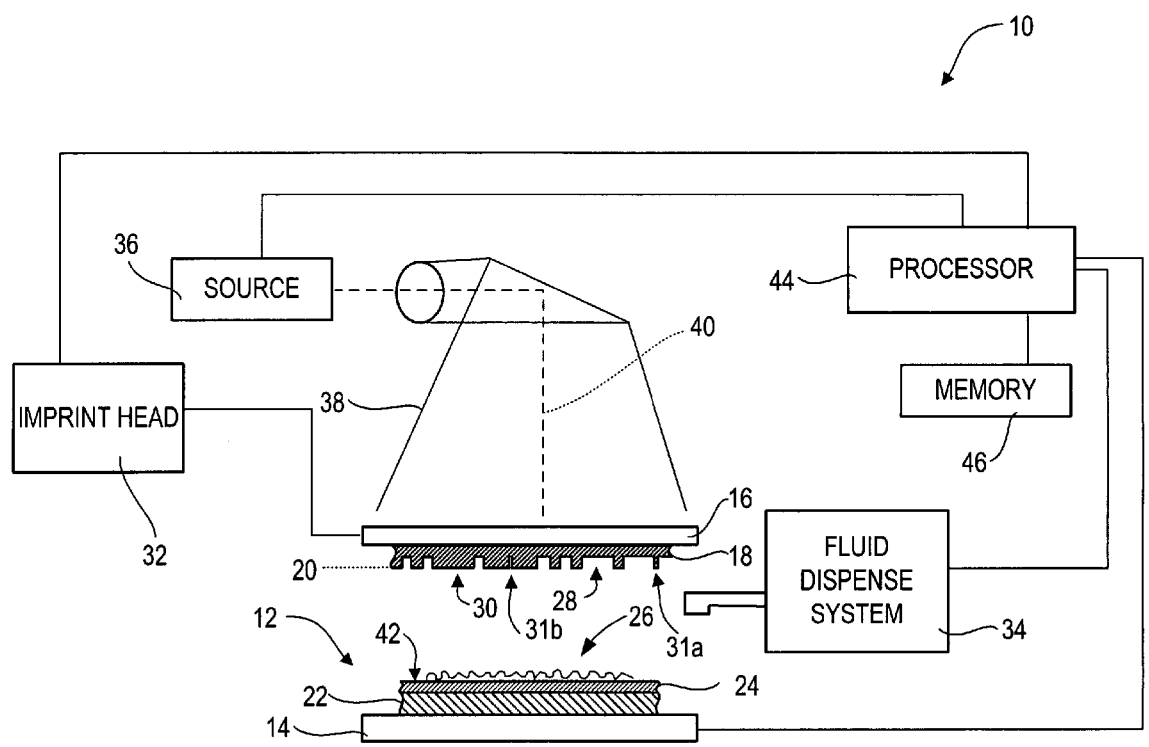

Referring to FIG. 1, a system 10 to form a relief pattern on a multi-layered structure 12 includes a stage 14 upon which multi-layered structure 12 is supported and a template 16, having a mold 18 with a patterning surface 20 thereon. In a further embodiment, multi-layered structure 12 may be coupled to a chuck (not shown), the chuck (not shown) being any chuck including, but not limited to, vacuum and electromagnetic.

Multi-layered structure 12 may comprise a substrate 22, a transfer layer 24, and a polymeric material 26, with transfer layer 24 being positioned between polymeric material 26 and substrate 22. Transfer layer 24 may comprise a low-k silicon containing dielectric and may be formed using any known techniques, dependent upon the materials and the application desired, including but not limited to drop dispense, spin-coating, dip coating, chemical vapor deposition (CVD), physical vapor deposition (PVD), and the like. In a further embodiment, multi-layered structure 12 may comprise an underlying organic layer (not shown) positioned between transfer layer 24 and substrate 22.

Polymeric material 26 may be an anti-reflective coating (BARC) layer, such as DUV30J-6 available from Brewer Science, Inc. of Rolla, Mo. Additionally, polymeric material 26 may be a silicon-containing low-k layer, or a BCB layer, for example. In an alternative embodiment, a composition for polymeric material 26 may be silicon-free and consists of the following:

COMPOSITION 1 isobornyl acrylate n-hexyl acrylate ethylene glycol diacrylate 2-hydroxy-2-methyl-1-phenyl-propan-1-one In COMPOSITION 1, isobornyl acrylate comprises approximately 55% of the composition, n-hexyl acrylate comprises approximately 27%, ethylene glycol diacrylate comprises approximately 15% and the initiator 2-hydroxy-2-methyl-1-phenyl-propan-1-one comprises approximately 3%. The initiator is sold under the trade name DAROCUR® 1173 by CIBA® of Tarrytown, N.Y. The above-identified composition also includes stabilizers that are well known in the chemical art to increase the operational life of the composition.

Template 16 and/or mold 18 may be formed from such materials including but not limited to, fused-silica, quartz, silicon, organic polymers, siloxane polymers, borosilicate glass, fluorocarbon polymers, metal, and hardened sapphire. As shown, patterning surface 20 comprises features defined by a plurality of spaced-apart recesses 28 and protrusions 30. Further, patterning surface 20 is shown comprising a protruding defect 31a and an indention defect 31b, with protruding defect 31a and indention defect 31b having a dimension less than a desired resolution, described further below. In a further embodiment, patterning surface 20 may be substantially smooth and/or planar. Patterning surface 20 may define an original pattern that forms the basis of a pattern to be formed on multi-layered structure 12.

Template 16 may be coupled to an imprint head 32 to facilitate movement of template 16, and therefore, mold 18. In a further embodiment, template 16 may be coupled to a template chuck (not shown), the template chuck (not shown) being any chuck including, but not limited to, vacuum and electromagnetic. A fluid dispense system 34 is coupled to be selectively placed in fluid communication with multi-layered structure 12 so as to deposit polymeric material 26 thereon. It should be understood that polymeric material 26 may be deposited using any known technique, e.g., drop dispense, spin-coating, dip coating, chemical vapor deposition (CVD), physical vapor deposition (PVD), and the like.

A source 36 of energy 38 is coupled to direct energy 38 along a path 40. Imprint head 32 and stage 14 are configured to arrange mold 18 and multi-layered structure 12, respectively, to be in superimposition and disposed in path 40. Either imprint head 32, stage 14, or both vary a distance between mold 18 and multi-layered structure 12 to define a desired volume therebetween that is filled by polymeric material 26.

Typically, polymeric material 26 is disposed upon multi-layered structure 12 before the desired volume is defined between mold 18 and multi-layered structure 12. However, polymeric material 26 may fill the volume after the desired volume has been obtained. After the desired volume is filled with polymeric material 26, source 36 produces energy 38, e.g., broadband ultraviolet radiation that causes polymeric material 26 to solidify and/or cross-link conforming to the shape of a surface 42 of multi-layered structure 12 and patterning surface 20. Control of this process is regulated by a processor 44 that is in data communication with stage 14, imprint head 32, fluid dispense system 34, source 36, operating on a computer readable program stored in a memory 46.

To that end, as mentioned above, either imprint head 32, stage 14, or both vary a distance between mold 18 and multi-layered structure 12 to define a desired volume therebetween that is filled by polymeric material 26. As a result, a pattern may be recorded in polymeric material 26 that conforms to a shape of patterning surface 20. However, it may be desired to pattern polymeric material 26 substantially absent of any features having a dimension less than a desired resolution ($d_R$). Features having a dimension less than a desired resolution may result in, inter alia, undesirable patterning of subsequent layers positioned on multi-layered structure 12, undesired functionality in devices formed from multi-layered structure 12, and misalignment between multi-layered structure 12 and mold 18.

Figure 2:
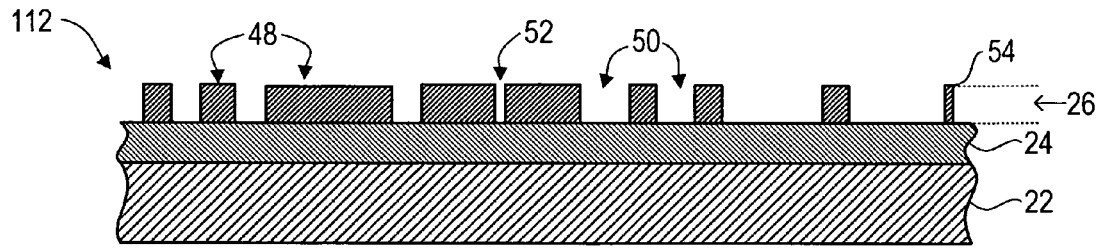

Referring to FIG. 2, multi-layered structure 12 is shown after being subjected to processing conditions to form a pattern therein, and more specifically, after contact with mold 18, shown in FIG. 1, defining a multi-layered structure 112 comprising a plurality of protrusions 48 and recessions 50. As mentioned above, mold 18, shown in FIG. 1, may comprise a protruding defect 31a and an indention defect 31b. As a result, upon contact between multi-layered structure 12 and mold 18, both shown in FIG. 1, polymeric material 26 may conform to protruding defect 31a and indention defect 31b to form a recessed defect 52 and a raised defect 54, respectively, in polymeric material 26, with recessed defect 52 and raised defect 54 having a dimension less than the desired resolution, which is undesirable. To that end, it may be desired to form multi-layered structure 112 substantially absent of recessed defect 52 and raised defect 54. To that end, a method of minimize, if not prevent, patterning of features having a dimension less than a desired resolution in multi-layered structure 12 is described below.

Figure 3:
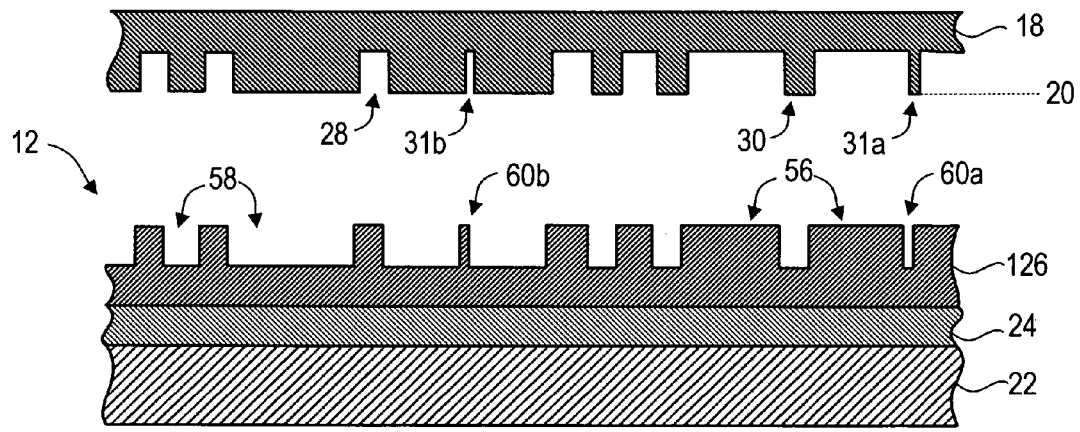

Referring to FIG. 3, in a first embodiment, to minimize, if not prevent, patterning of recessed defect 52, shown in FIG. 2, within multi-layered structure 12 patterning surface 20 of mold 18 may be modified prior to contact with multi-layered structure 12. More specifically, a dimension of recessions 28 and indention defect 31b of patterning surface 20 may be increased along a first direction by a factor of ($k \times d_R$), with k generally being less than 1 and the first direction being orthogonal to patterning surface 20. Contact between multi-layered structure 12 and mold 18 may then occur, with polymeric fluid 26 conforming to a shape of patterning surface 20, defining a polymerizable layer 126 having a first shape. Recessions 28 and protrusions 30 of mold 18 may define protrusions 56 and recessions 58, respectively, in polymerizable layer 126, and protruding defect 31a and indention defect 31b may define a recessed defect 60a and raised defect 60b, respectively, in polymerizable layer 126, which are undesirable. Further, protrusions 56, recessions 58, recessed defect 60a, and raised defect 60b may extend from multi-layered structure 12 in a second direction, orthogonal to the first direction and orthogonal to surface 42 of multi-layered structure 12, shown in FIG. 1.

Figure 4:
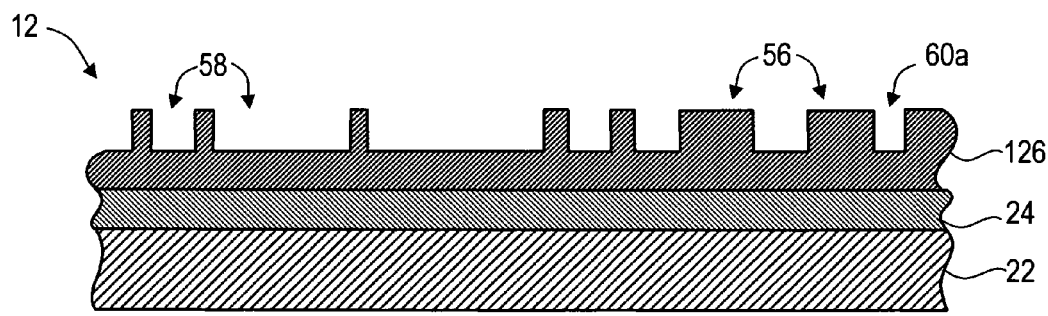

Referring to FIG. 4, multi-layered structure 12 is shown after subjecting polymerizable layer 126 to a trim etch process. To that end, a dimension of protrusions 56 and raised defect 60b, shown in FIG. 3, of polymerizable layer 126 may be decreased in a third direction, orthogonal to the second direction, by the aforementioned factor of ($k \times d_R$). As a result of subjecting polymerizable layer 126 to the aforementioned trim etch process, any features positioned upon polymerizable layer 126 having a dimension less than the factor ($k \times d_R$) may be removed from multi-layered structure 12. As a result, raised defect 60b, shown in FIG. 3, may be removed from multi-layered structure 12, as desired. However, a dimension of recessed defect 60a may be increased along the third direction.

Figure 5:
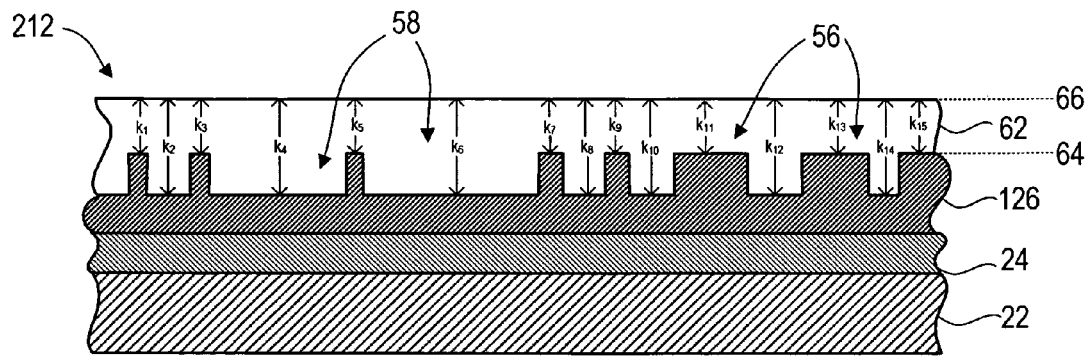

Referring to FIG. 5, after removal of raised defect 60b from multi-layered structure 12, both shown in FIG. 3, a reverse tone of protrusions 56 are transferred into transfer layer 24. To that end, a conformal layer 62 may be positioned over protrusions 56, defining a multi-layered structure 212. This may be achieved by methods including, but not limited to, spin-on techniques, contact planarization, and the like. To that end, conformal layer 62 may be formed from exemplary compositions such as:

COMPOSITION 2 hydroxyl-functional polysiloxane hexamethoxymethylmelamine toluenesulfonic acid methyl amyl ketone

COMPOSITION 2 hydroxyl-functional polysiloxane hexamethoxymethylmelamine gamma-glycidoxypropyltrimethoxysilane toluenesulfonic acid methyl amyl ketone In COMPOSITION 2, hydroxyl-functional polysiloxane comprises approximately 4% of the composition, hexamethoxymethylmelamine comprisies approximately 0.95%, toluenesulfonic acid comprises approximately 0.05% and methyl amyl ketone comprises approximately 95%. In COMPOSITION 3, hydroxyl-functional polysiloxane comprises approximately 4% of the composition, hexamethoxymethylmelamine comprisies approximately 0.7%, gamma-glycidoxypropyltrimethoxysilane comprises approximately 0.25%, toluenesulfonic acid comprises approximately 0.05%, and methyl amyl ketone comprises approximately 95%.

Conformal layer 62 includes first and second opposed sides. First side 64 faces polymerizable layer 126. The second side faces away from polymerizable layer 126, forming normalization surface 66. Normalization surface 66 is provided with a substantially normalized profile by ensuring that the distances $k_1$, $k_3$, $k_5$, $k_7$, $k_9$, $k_{11}$, $k_{13}$, and $k_{15}$ between protrusions 56 and normalization surface 66 are substantially the same and that the distance $k_2$, $k_4$, $k_6$, $k_8$, $k_{10}$, $k_{12}$, and $k_{14}$ between recessions 58 and normalization surface 66 are substantially the same.

One manner in which to provide normalization surface 66 with a normalized profile is to contact conformal layer 62 with a planarizing mold (not shown) having a planar surface. Thereafter, the planarizing mold (not shown) is separated from conformal layer 62 and radiation impinges upon conformal layer 62 to polymerize and, therefore, to solidify the same. The radiation impinged upon conformal layer 46 may be ultraviolet, thermal, electromagnetic, visible light, heat, and the like. In a further embodiment, the radiation impinged upon conformal layer 62 may be impinged before the planarizing mold (not shown) is separated from conformal layer 62. To ensure that conformal layer 62 does not adhere to the planarizing mold (not shown), a low surface energy coating may be deposited upon the planarizing mold (not shown).

Alternatively, release properties of conformal layer 62 may be improved by including in the material from which the same is fabricated a surfactant. The surfactant provides the desired release properties to reduce adherence of conformal layer 62 to the planarizing mold (not shown). For purposes of this invention, a surfactant is defined as any molecule, one tail of which is hydrophobic. Surfactants may be either fluorine containing, e.g., include a fluorine chain, or may not include any fluorine in the surfactant molecule structure. An exemplary surfactant is available under the trade name ZONYL® FSO-100 from DUPONT™ that has a general structure of $R_1R_2$, where $R_1$=F($CF_2CF_2$)$_y$, with y being in a range of 1 to 7, inclusive and $R_2$=$CH_2CH_2O$ ($CH_2CH_2O$)$_x$H, where X being in a range of 0 to 15, inclusive. It should be understood that the surfactant may be used in conjunction with, or in lieu of, the low surface energy coating that may be applied to the planarizing mold (not shown).

Figure 6:
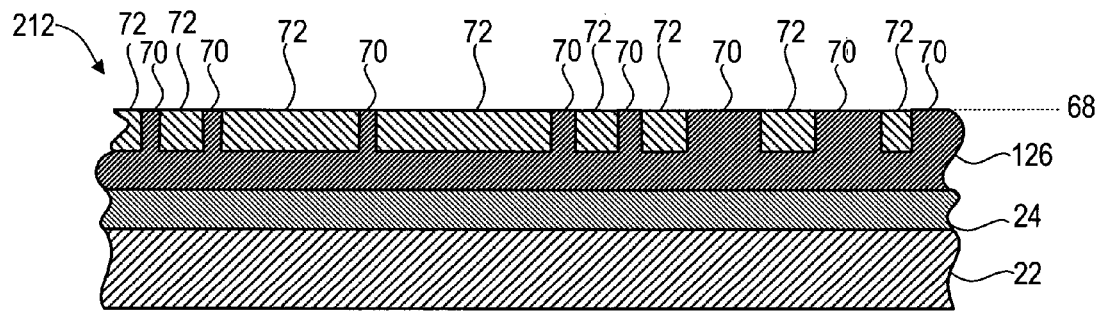

Referring to FIGS. 5 and 6, a blanket etch is employed to remove portions of conformal layer 62 to provide multi-layered structure 212 with a crown surface 68. Crown surface 68 is defined by an exposed surface 70 of each of protrusions 56 and upper surfaces of portions 72 that remain on conformal layer 62 after the blanket etch. The blanket etch may be a wet etch or dry etch. In a further embodiment, a chemical mechanical polishing/planarization may be employed to remove portions of conformal layer 62 to provide multi-layered structure 212 with crown surface 68.

Figure 7:
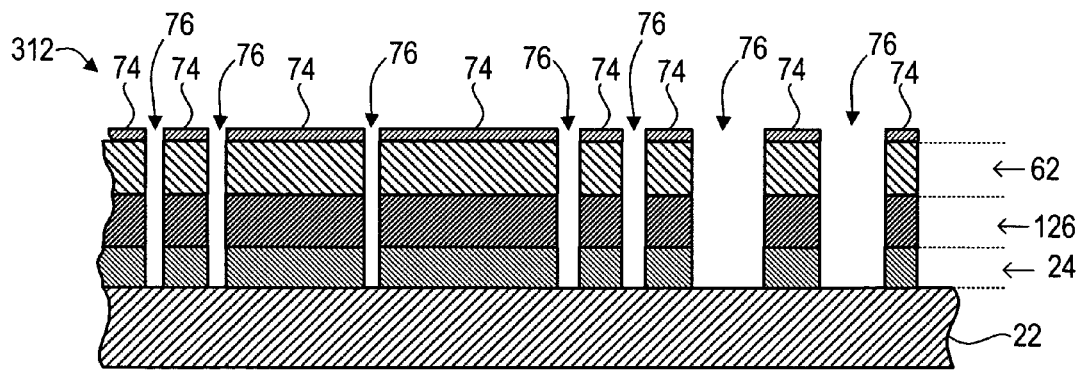

Referring to FIGS. 5, 6, and 7, crown surface 68 is subjected to an anisotropic plasma etch. The etch chemistry of the anisotropic etch is selected to maximize etching of protrusions 56, while minimizing etching of portions 72. In the present example, advantage was taken of the distinction of the silicon content between protrusions 56 and conformal layer 62. Specifically, employing a plasma etch with an oxygen-based chemistry, it was determined that an in-situ hardened mask 74 would be created in the regions of portions 72 proximate to crown surface 68, forming a multi-layered structure 312. This results from the interaction of the silicon-containing polymerizable material with the oxygen plasma. As a result of hardened mask 74 and the anisotropy of the etch process, regions 76 of substrate 22 in superimposition with protrusions 56 are exposed.

Figure 8:
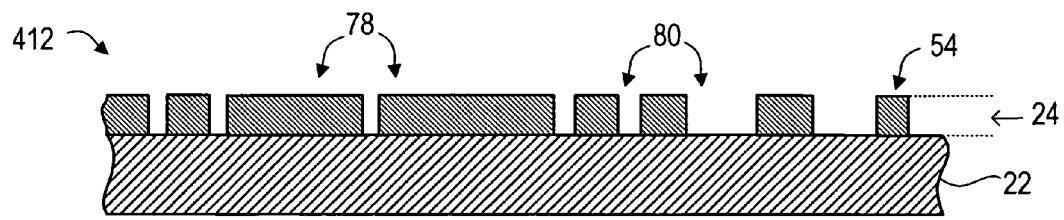

Referring to FIGS. 7 and 8, hardened mask 74, conformal layer 62, and polymerizable layer 126 may be removed by exposing multi-layered structure 312 to a blanket fluorine etch, defining a multi-layered structure 412 having protrusions 78 and recessions 80. To that end, recessed defect 52, shown in FIG. 2, is removed from multi-layered structure 412, as desired. However, a dimension of raised defect 54 may be increased along the third direction. Furthermore, raised defect 54 may not have a dimension greater than ($2k \times d_R$), and thus, the raised defect 54 may have no undesirable effects on devices formed from multi-layered structure 12.

Figure 9:
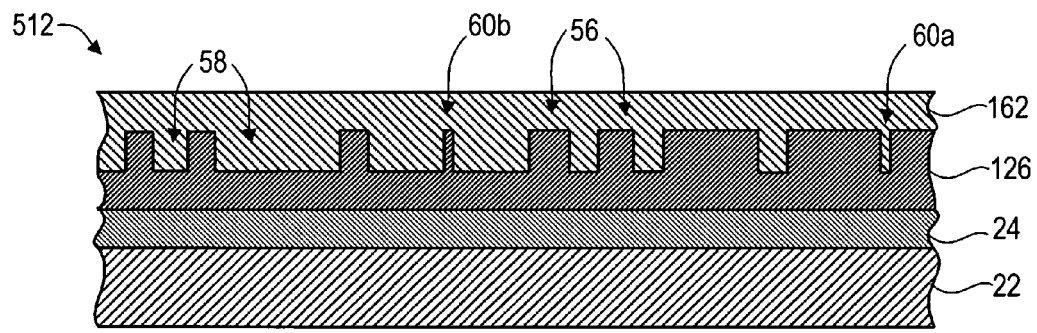
FIG. 9 is a simplified side view of the multi-layered structure shown in FIG. 3, having a conformal layer positioned thereon.

Referring to FIG. 9, in a second embodiment, to minimize, if not prevent, patterning of raised defect 54 within multi-layered structure 12, both as shown in FIG. 2, patterning surface 20 of mold 18 may be modified prior to contact with multi-layered structure 12, analogous to that mentioned above with respect to FIG. 3. To that end, after contact between mold 18 and polymeric material 26 to define polymerizable layer 126, conformal layer 162 may be positioned upon polymerizable layer 126, defining a multi-layered structure 512. Conformal layer 162 may be analogous to that as mentioned above with respect to FIG. 5.

Figure 10:
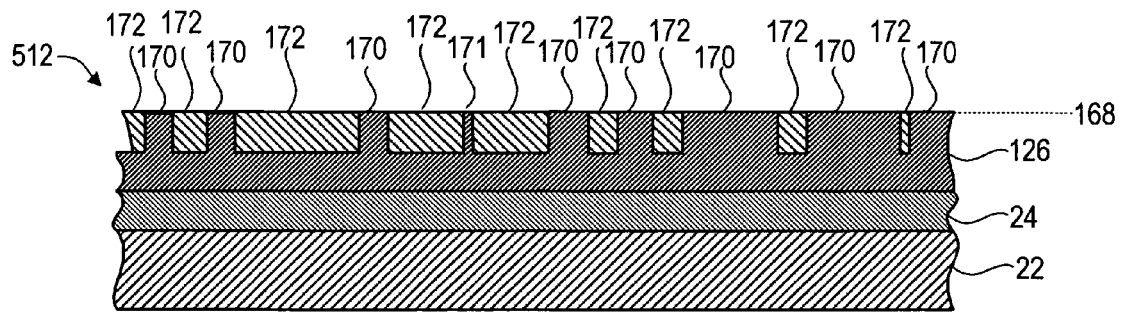
FIG. 10 is simplified side view of the multi-layered structure shown in FIG. 9, having a crown surface formed thereon.

Referring to FIGS. 9 and 10, analogous to that as mentioned above with respect to FIGS. 5 and 6, a blanket etch is employed to remove portions of conformal layer 162 to provide multi-layered structure 512 with a crown surface 168. Crown surface 168 is defined by an exposed surface 170 of each of protrusions 56 and an exposed surface 171 of raised defect 60b and upper surfaces of portions 172 that remain on conformal layer 162 after the blanket etch. The blanket etch may be a wet etch or dry etch. In a further embodiment, a chemical mechanical polishing/planarization may be employed to remove portions of conformal layer 162 to provide multi-layered structure 512 with crown surface 168.

Figure 11:
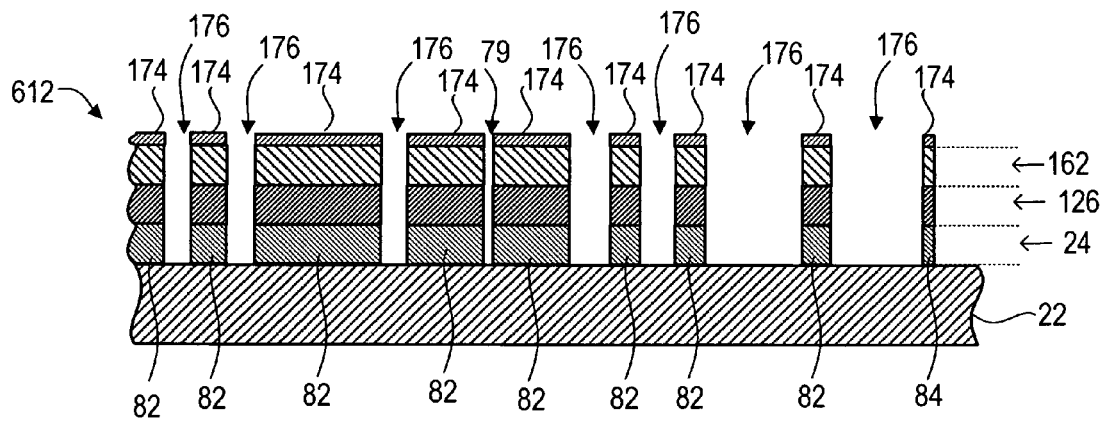
FIG. 11 is a simplified side view of the multi-layered structure shown in FIG. 10 after subjecting the crown surface to an etch process to expose regions of the substrate.

Referring to FIGS. 9, 10, and 11, analogous to that as mentioned above with respect to FIGS. 5, 6, and 7, crown surface 168 is subjected to an anisotropic plasma etch. The etch chemistry of the anisotropic etch is selected to maximize etching of protrusions 56 and raised defect 60b, while minimizing etching of portions 172. In the present example, advantage was taken of the distinction of the silicon content between protrusions 56/raised defect 60b and conformal layer 162. Specifically, employing a plasma etch with an oxygen-based chemistry, it was determined that an in-situ hardened mask 174 would be created in the regions of portions 172 proximate to crown surface 168, forming a multi-layered structure 612. This results from the interaction of the silicon-containing polymerizable material with the oxygen plasma. As a result of hardened mask 174 and the anisotropy of the etch process, regions 176 in superimposition with protrusions 56 and region 79 in superimposition with raised defect 60b are exposed, defining protrusions 82 in superimposition with recesses 58 and defect 84 in superimposition with recessed defect 60a.

Figure 12:
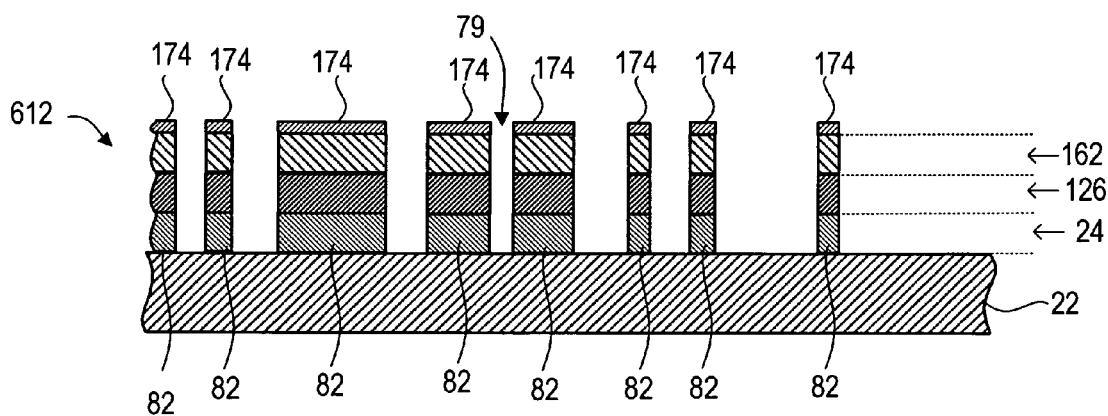
FIG. 12 is a simplified side view of the multi-layered structure shown in FIG. 11, after exposure to a trim etch to eliminate features associated with the protruding defect of the mold.

Referring to FIG. 12, multi-layered structure 612 is shown after being subjected to a trim etch process. To that end, a dimension of protrusions 82 and defect 84, shown in FIG. 11, may be decreased in the third direction by the aforementioned factor of ($k \times d_R$). As a result, any features positioned upon multi-layered structure 612 having a dimension less than the factor ($k \times d_R$) may be removed from multi-layered structure 612, and more specifically, defect 84, shown in FIG. 11, may be removed from multi-layered structure 612, as desired. However, a dimension of region 79 may be increased along the third direction.

Figure 13:
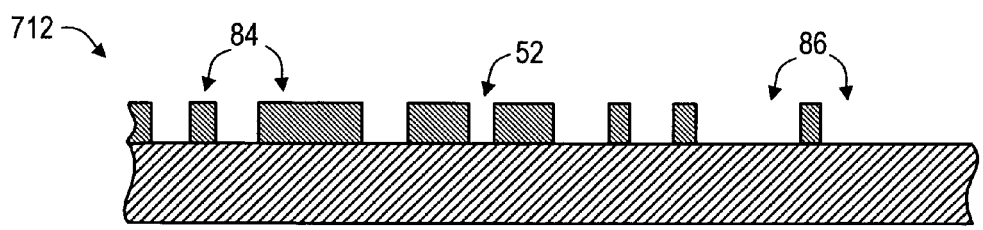
FIG. 13 is a simplified side view of the multi-layered structure shown in FIG. 12, after exposure to a blanket etch.

Referring to FIGS. 12 and 13, analogous to that as mentioned above with respect to FIGS. 7 and 8, hardened mask 174, conformal layer 162, and polymerizable layer 126 may be removed by exposing multi-layered structure 612 to a blanket fluorine etch, defining a multi-layered structure 712 having protrusions 82 and recessions 86. To that end, raised defect 54, shown in FIG. 2, may be removed from multi-layered structure 712, as desired. However, a dimension of recessed defect 52 may be increased along the third direction.

Figure 14:
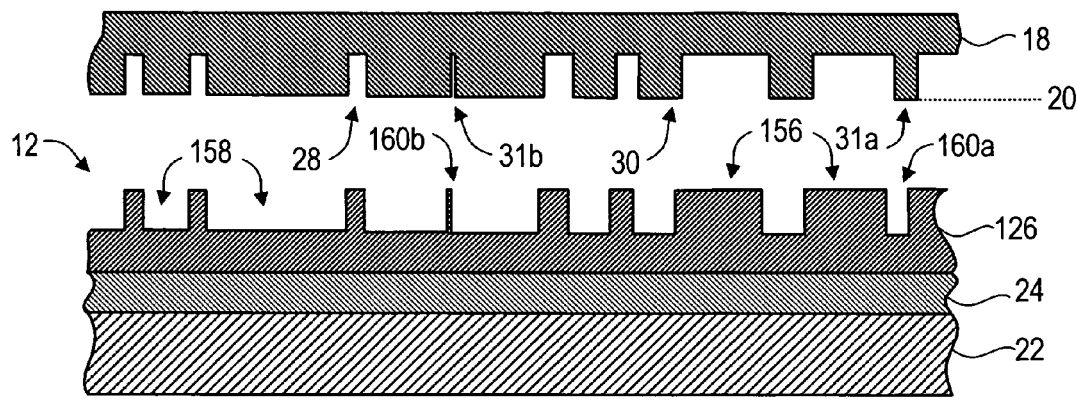
FIG. 14 is a simplified side view of the mold having protruding and indention defects therein, after contact with the multi-layered structure shown in FIG. 1, forming a plurality of features therein.

Referring to FIG. 14, in a third embodiment, to minimize, if not prevent, patterning of recessed defect 52 and raised defect 54 within multi-layered structure 12, as shown in FIG. 2, patterning surface 20 of mold 18 may be modified prior to contact with multi-layered structure 12. More specifically, a dimension of recessions 28 and indention defect 31b of patterning surface 20 may be decreased along the first direction by a factor of (k×d$_r$) and the first direction being orthogonal to patterning surface 20. Contact between multi-layered structure 12 and mold 18 may then occur, with polymeric fluid 26 conforming to a shape of patterning surface 20, defining a polymerizable layer 126. Recessions 28 and protrusions 30 of mold 18 may define protrusions 156 and recessions 158, respectively, in polymerizable layer 126, and protruding defect 31a and indention defect 31b may define a recessed defect 160a and raised defect 160b, respectively, in polymerizable layer 126, which are undesirable. Further, protrusions 156, recessions 158, recessed defect 160a, and raised defect 160b may extend from multi-layered structure 12 in the second direction, orthogonal to the first direction and orthogonal to surface 42 of multi-layered structure 12, shown in FIG. 1.

Figure 15:
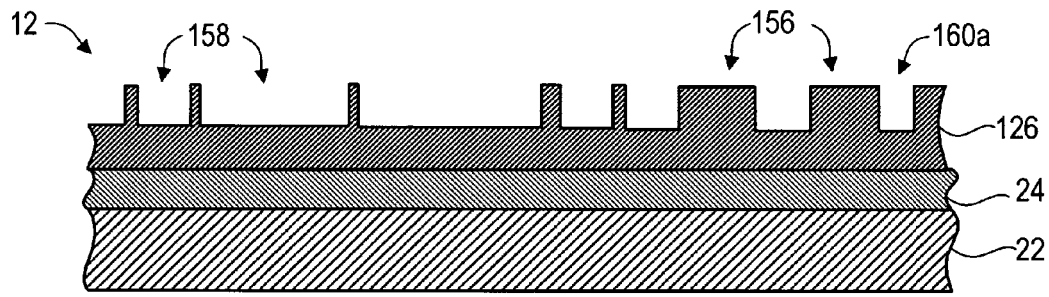
FIG. 15 is a simplified side view of the multi-layered structure shown in FIG. 14, after exposure to a trim etch to eliminate features associated with the indentation defect of the mold.

Referring to FIG. 15, multi-layered structure 12 is shown after subjecting polymerizable layer 126 to a trim etch process. To that end, a dimension of protrusions 158 and raised defect 160b, shown in FIG. 14, of polymerizable layer 126 may be decreased in the second direction by the factor of (k×d$_r$). As a result of subjecting polymerizable layer 126 to the aforementioned trim etch process, any features positioned upon polymerizable layer 126 having a dimension less than the factor (k×d$_r$) may be removed from multi-layered structure 12. As a result, raised defect 160b, shown in FIG. 14, may be removed from multi-layered structure 12, as desired. However, a dimension of recessed defect 160a may be increased along the third direction.

Figure 16:
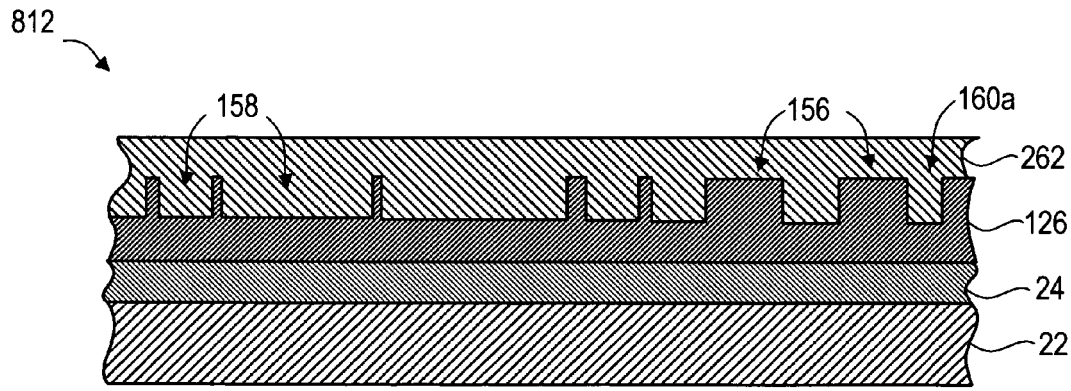
FIG. 16 is a simplified side view of the multi-layered structure shown in FIG. 15, having a conformal layer positioned thereon.

Referring to FIG. 16, after removal of raised defect 160b from multi-layered structure 12, both shown in FIG. 14, a reverse tone of protrusions 156 are transferred into transfer layer 24. To that end, a conformal layer 262 may be positioned over protrusions 156, defining a multi-layered structure 812. Conformal layer 262 may be analogous to that as mentioned above with respect to FIG. 5.

Figure 17:
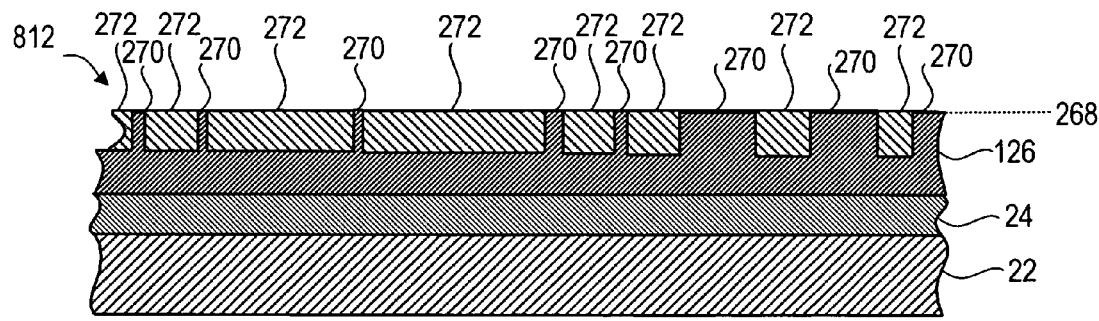
FIG. 17 is a simplified side view of the multi-layered structure shown in FIG. 16, having a crown surface formed thereon.

Referring to FIGS. 16 and 17, analogous to that as mentioned above with respect to FIGS. 5 and 6, a blanket etch is employed to remove portions of conformal layer 262 to provide multi-layered structure 812 with a crown surface 268. Crown surface 268 is defined by an exposed surface 270 of each of protrusions 156 and upper surfaces of portions 272 that remain on conformal layer 262 after the blanket etch. The blanket etch may be a wet etch or dry etch. In a further embodiment, a chemical mechanical polishing/planarization may be employed to remove portions of conformal layer 262 to provide multi-layered structure 812 with crown surface 268.

Figure 18:
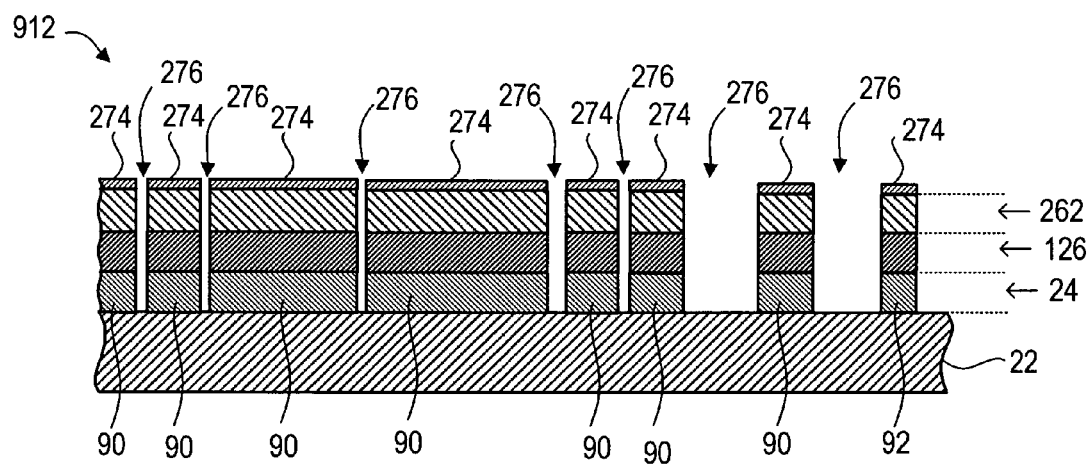
FIG. 18 is a simplified side view of the multi-layered structure shown in FIG. 17, after subjecting the crown surface to an etch process to expose regions of the substrate.

Referring to FIGS. 16, 17, and 18, analogous to that as mentioned above with respect to FIGS. 5, 6, and 7, crown surface 268 is subjected to an anisotropic plasma etch. The etch chemistry of the anisotropic etch is selected to maximize etching of protrusions 156, while minimizing etching of portions 272. In the present example, advantage was taken of the distinction of the silicon content between protrusions 156 and conformal layer 262. Specifically, employing a plasma etch with an oxygen-based chemistry, it was determined that an in-situ hardened mask 274 would be created in the regions of portions 272 proximate to crown surface 268, forming a multi-layered structure 912. This results from the interaction of the silicon-containing polymerizable material with the oxygen plasma. As a result of hardened mask 274 and the anisotropy of the etch process, regions 276 in superimposition with protrusions 56 are exposed, defining protrusions 90 in superimposition with recesses 158 and defect 92 in superimposition with recessed defect 160a, shown in FIG. 14.

Figure 19:
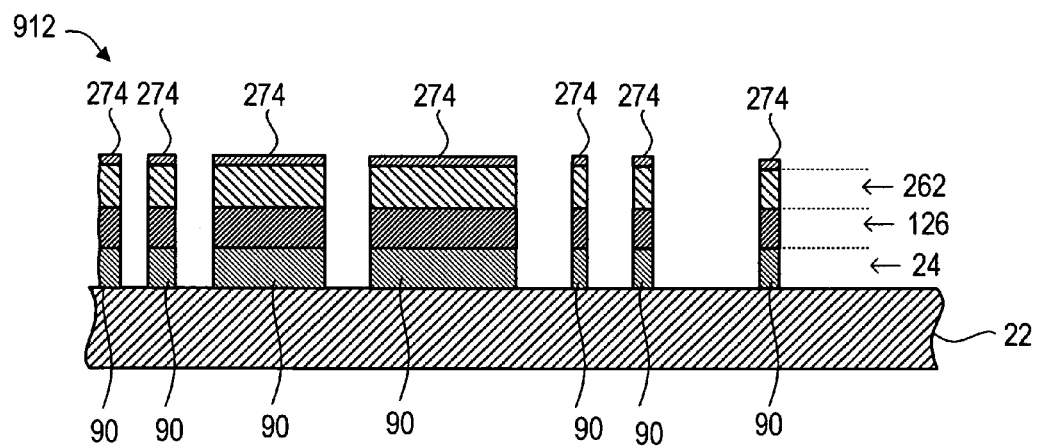
FIG. 19 is a simplified side view of the multi-layered structure shown in FIG. 18, after exposure to a trim etch to eliminate features associated with the protruding defect of the mold.

Referring to FIG. 19, multi-layered structure 912 is shown after being subjected to a trim etch process. To that end, a dimension of protrusions 90 and defect 92, shown in FIG. 18, may be decreased in the third direction by the factor (2×k×d$_r$). As a result, any features positioned upon multi-layered structure 912 having a dimension less than the factor (2×k×d$_r$) may be removed from multi-layered structure 912, and more specifically, defect 92, both shown in FIG. 18, may be removed from multi-layered structure 912, as desired.

Figure 20:
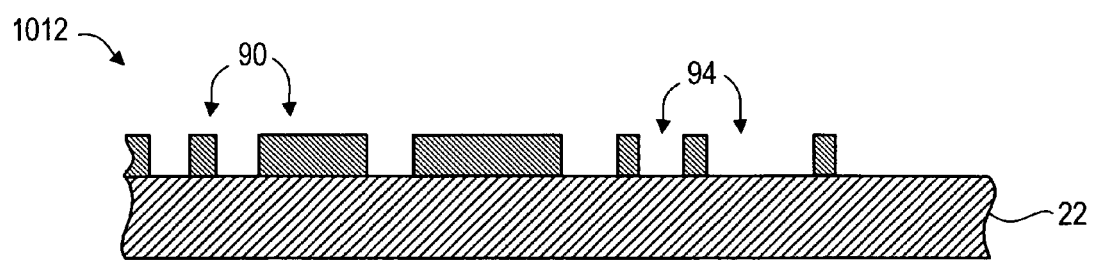
FIG. 20 is a simplified side view of the multi-layered structure shown in FIG. 19, after exposure to a blanket etch.

Referring to FIGS. 19 and 20, analogous to that as mentioned above with respect to FIGS. 7 and 8, hardened mask 274, conformal layer 262, and polymerizable layer 126 may be removed by exposing multi-layered structure 912 to a blanket fluorine etch, defining a multi-layered structure 1012 having protrusions 90 and recessions 94. To that end, recessed defect and raised defect 54, shown in FIG. 2, may be removed from multi-layered structure 1012, as desired.

Referring to FIG. 11, in still a further embodiment, to minimize, if not prevent, patterning of recessed defect 52, a conformal coating (not shown) may be positioned upon multi-layered structure 612 such that region 79 in superimposition with raised defect 60b may be filled with the conformal coating (not shown) and a desired dimension of protrusions 82 may be obtained. The conformal coating (not shown) may be that similar to one used in RELACS® by Clariant, Inc. Further, multi-layered structure 612 may be subjected the blanket etch, as mentioned above with respect to FIGS. 7 and 8, to obtain the desired structure. In still a further embodiment, in place of the conformal coating (not shown), a reflow process may be employed wherein the polymerizable layer 126 may be heated over a glass transition temperature associated therewith.

In still a further embodiment, referring to FIG. 2, multi-layered structure 112 may be formed employing electron beam lithography, ion beam lithography, etc. As a result, the above-mentioned methods of removing of defects formed upon multi-layered structure 112 may be applied. More specifically, a desired pattern to be formed upon multi-layered structure 112 may be stored in a computer-readable memory (not shown). To that end, prior to formation of protrusions 48 and recessions 50 upon multi-layered structure 112, the desired pattern located in the computer-readable memory (not shown) may be altered such that a dimension of protrusions 50 may be increased in the third direction by a factor $a_1$. To that end, upon formation of protrusions 48 and recession 50 upon multi-layered structure 112, protrusions 48 may be subjected to a trim etch process, analogous to that as mentioned above with respect to FIG. 3, to remove raised defect 60b while obtaining the desired pattern in multi-layered structure 112.

The embodiments of the present invention described above are exemplary. Many changes and modification may be made to the disclosure recited above, while remaining within the scope of the invention. The scope of the invention should, therefore, be determined with reference to the appended claims along with their full scope of equivalents.

What is claimed is:

1. A method of forming a desired pattern in a patterning layer positioned on a substrate with a mold, said method comprising:

contacting said patterning layer with said mold forming a shape therein having a plurality of features extending in a first direction; and altering dimensions of said shape of said patterning layer in a second direction, orthogonal to said first direction, to completely remove a subset of said plurality of features having a dimension less that a predetermined magnitude while obtaining said desired pattern in said patterning layer.

2. The method as recited in claim 1 wherein altering further includes trim etching said plurality of features in said patterning layer.

3. The method as recited in claim 1 wherein altering further includes trim etching said plurality of features in said patterning layer to remove said subset of said plurality of features having a dimension less that said predetermined magnitude while decreasing a dimension of remaining features of said plurality of features along said second direction to form said desired pattern in said patterning layer.

4. The method as recited in claim 1 further including transferring an inverse of said desired pattern into a transfer layer positioned between said substrate and said patterning layer subsequent to altering said dimensions of said shape of said patterning layer.

5. The method as recited in claim 1 further including transferring an inverse of said desired pattern into a transfer layer positioned between
said substrate and said patterning layer prior to altering said dimensions of said shape of said patterning layer.

6. The method as recited in claim 1 further including modifying a pattern of said mold prior to contact with said patterning layer.

7. The method as recited in claim 1 wherein said mold comprises a plurality of protrusions and recessions, with said method further including increasing a dimension of said plurality of recessions along a third direction, parallel to said second direction.

8. The method as recited in claim 1 wherein altering further includes trim etching said plurality of features in said patterning layer by a constant and removing a subset of said plurality of features having a dimension less than said constant.

9. The method as recited in claim 1 wherein said first direction is orthogonal to a surface of said substrate.

10. A method of forming a desired pattern in a patterning layer positioned on a substrate with a mold having a plurality of protrusions and recessions including a defect, said method comprising:
modifying a dimension of said plurality of recessions of said mold along a first direction;
contacting said patterning layer with said mold forming a shape therein having a plurality of features extending in a second direction; and
altering dimensions of said shape of said patterning layer along a third direction, orthogonal to said second direction, to completely remove a subset of said plurality of features associated with said defect while obtaining said desired pattern in said patterning layer.

11. The method as recited in claim 10 wherein altering further includes removing said subset of said plurality of features having a dimension less than a predetermined magnitude.

12. The method as recited in claim 10 wherein altering further includes trim etching said plurality of features in said patterning layer.

13. The method as recited in claim 10 wherein altering further includes trim etching said plurality of features in said patterning layer to remove said subset of said plurality of features associated with said defect while decreasing a dimension of remaining features of said plurality of features along said third direction to form said desired pattern in said patterning layer.

14. The method as recited in claim 10 further including transferring an inverse of said desired pattern into a transfer layer positioned between said substrate and said patterning layer subsequent to altering said dimensions of said shape of said patterning layer.

15. The method as recited in claim 10 further including transferring an inverse of said desired pattern into a transfer layer positioned between said substrate and said patterning layer prior to altering said dimensions of said shape of said patterning layer.

16. The method as recited in claim 10 wherein altering further includes trim etching said plurality of features in said patterning layer by a constant and removing a subset of said plurality of features having a dimension less than said constant.

17. A method of forming a desired pattern on a substrate with a mold having a plurality of protrusions and recessions, said method comprising:
increasing a dimension of said plurality of protrusions of said mold along a first direction;
contacting a patterning layer positioned on said substrate with said mold forming a first shape therein having a plurality of first features extending in a second direction;
altering dimensions of said first shape of said patterning layer along a third direction, orthogonal to said second direction, to completely eliminate a subset of said plurality of first features having a dimension less than a predetermined magnitude;
transferring an inverse of said first shape into a transfer layer positioned between said patterning layer and said substrate, defining a second shape having a plurality of second features extending in said second direction; and
altering dimensions of said second shape of said transfer layer along said third direction to eliminate a subset of said plurality of second features having a dimension less than a predetermined magnitude while obtaining said desired pattern in said transfer layer.

18. The method as recited in claim 17 wherein altering dimensions of said first shape further includes trim etching said plurality of first features in said patterning layer and altering dimensions of said second shape further includes trim etching said plurality of second features in said transfer layer.

19. A method of forming a desired pattern in a patterning layer positioned on a substrate, said method comprising:
forming a shape in said patterning layer employing electron beam lithography, said shape having a plurality of features extending in a first direction; and
altering dimensions of said shape of said patterning layer in a second direction, orthogonal to said first direction, to completely remove a subset of said plurality of features having a dimension less that a predetermined magnitude while obtaining said desired pattern in said patterning layer.

* * * * *